(12) United States Patent
Paillet et al.

(10) Patent No.: US 7,088,191 B2
(45) Date of Patent: Aug. 8, 2006

(54) DELAY INTERPOLATION IN A RING OSCILLATOR DELAY STAGE

(75) Inventors: Fabrice Paillet, Hillsboro, OR (US); David Rennie, Etobicoke (CA); Tanay Karnik, Portland, OR (US); Jianping Xu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 10/953,023

(22) Filed: Sep. 29, 2004

(65) Prior Publication Data

US 2006/0071722 A1 Apr. 6, 2006

(51) Int. Cl.
*H03K 3/03* (2006.01)
*H03L 7/00* (2006.01)

(52) U.S. Cl. .......................... 331/57; 327/161
(58) Field of Classification Search .................. 331/57; 327/158, 163, 161
See application file for complete search history.

(56) References Cited

U.S. PATENT DOCUMENTS

| 5,374,860 | A * | 12/1994 | Llewellyn ................... 327/276 |
| 6,329,859 | B1 * | 12/2001 | Wu ............................ 327/291 |
| 6,396,358 | B1 * | 5/2002 | Poss et al. .................... 331/57 |
| 6,539,072 | B1 * | 3/2003 | Donnelly et al. ............ 375/371 |
| 6,995,594 | B1 * | 2/2006 | Buchwald et al. ........... 327/248 |
| 2003/0002607 | A1 * | 1/2003 | Mooney et al. .............. 375/355 |

OTHER PUBLICATIONS

Kostas Pagiamtzis, "ECE1352 Analog Integrated Circuits Reading Assignment: Phase Interpolating Circuits", Nov. 12, 2001. 20pgs.

* cited by examiner

*Primary Examiner*—Robert Pascal
*Assistant Examiner*—James Goodley
(74) *Attorney, Agent, or Firm*—Buckley, Maschoff & Talwalkar LLC

(57) ABSTRACT

According to some embodiments, a circuit includes a delay stage of a ring oscillator. The delay stage may include a first differential pair, a second differential pair, and a third differential pair. The first differential pair may be coupled to a first current-steering circuit, receive a differential input signal, and output a first differential signal. The second differential pair may receive the differential input signal and output a second differential signal, and the third differential pair may be coupled to a second current-steering circuit, receive the second differential signal from the second differential pair, and output the first differential signal. An amount of delay between the differential input signal and the first differential signal is based on relative amounts of current steered by the first current-steering circuit and the second current-steering circuit.

14 Claims, 6 Drawing Sheets

DELAY INTERPOLATION IN A RING OSCILLATOR DELAY STAGE

BACKGROUND

Ring oscillators are often used to provide clock signals having a controllable frequency. A ring oscillator typically consists of several series-connected delay stages, with the output of the last delay stage being fed into the first delay stage. The frequency of oscillation may be controlled by changing the delay associated with each delay stage. According to some techniques, this delay is changed by varying the resistance of a PMOS load located in each delay stage.

Some ring oscillator designs use interpolation to change the delay associated with each delay stage. According to one example, each delay stage provides two signal paths, with each path presenting a different delay. Control signals control an amount of interpolation between the delay of the slower path and the delay of the faster path. The resulting delay of the delay stage lies somewhere between the different delays presented by the two paths.

DETAILED DESCRIPTION

Figure 1:
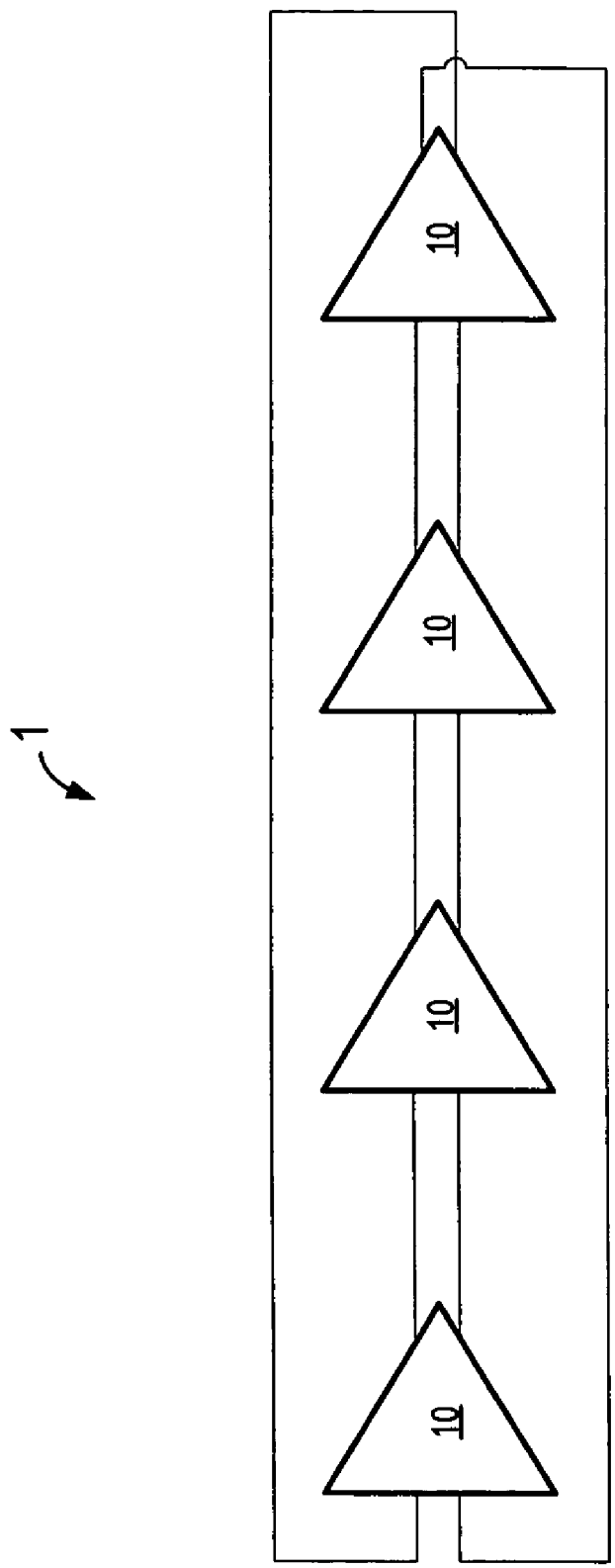
FIG. 1 is a block diagram of a ring oscillator according to some embodiments.

FIG. 1 illustrates one example of a ring oscillator according to some embodiments. Oscillator 1 comprises four instances of delay stage 10. As mentioned above, each instance of delay stage 10 outputs a differential signal to a next instance of delay stage 10 and receives a differential signal from a previous delay stage. The differential signals output by a delay stage 10 of oscillator 1 may differ by 45 degrees from the differential signals output by adjacent delay stages 10. Other unshown signal lines may connect stages 10 to power, ground, and various control signals.

According to some embodiments, at least one of delay stages 10 includes a first differential pair and a second differential pair. The first differential pair receives a differential input signal, outputs a first differential signal, and is coupled to a first current-steering circuit. The second differential pair also receives the differential input signal and outputs a second differential signal. The at least one delay stage 10 also includes a third differential pair coupled to a second current-steering circuit, the third differential pair to receive the second differential signal from the second differential pair and to output the first differential signal. An amount of delay between the differential input signal and the first differential signal is based on relative amounts of current steered by the first current-steering circuit and the second current-steering circuit. A schematic diagram of a delay stage 10 according to some embodiments of the foregoing will be discussed in detail below with respect to FIG. 3.

Figure 2:
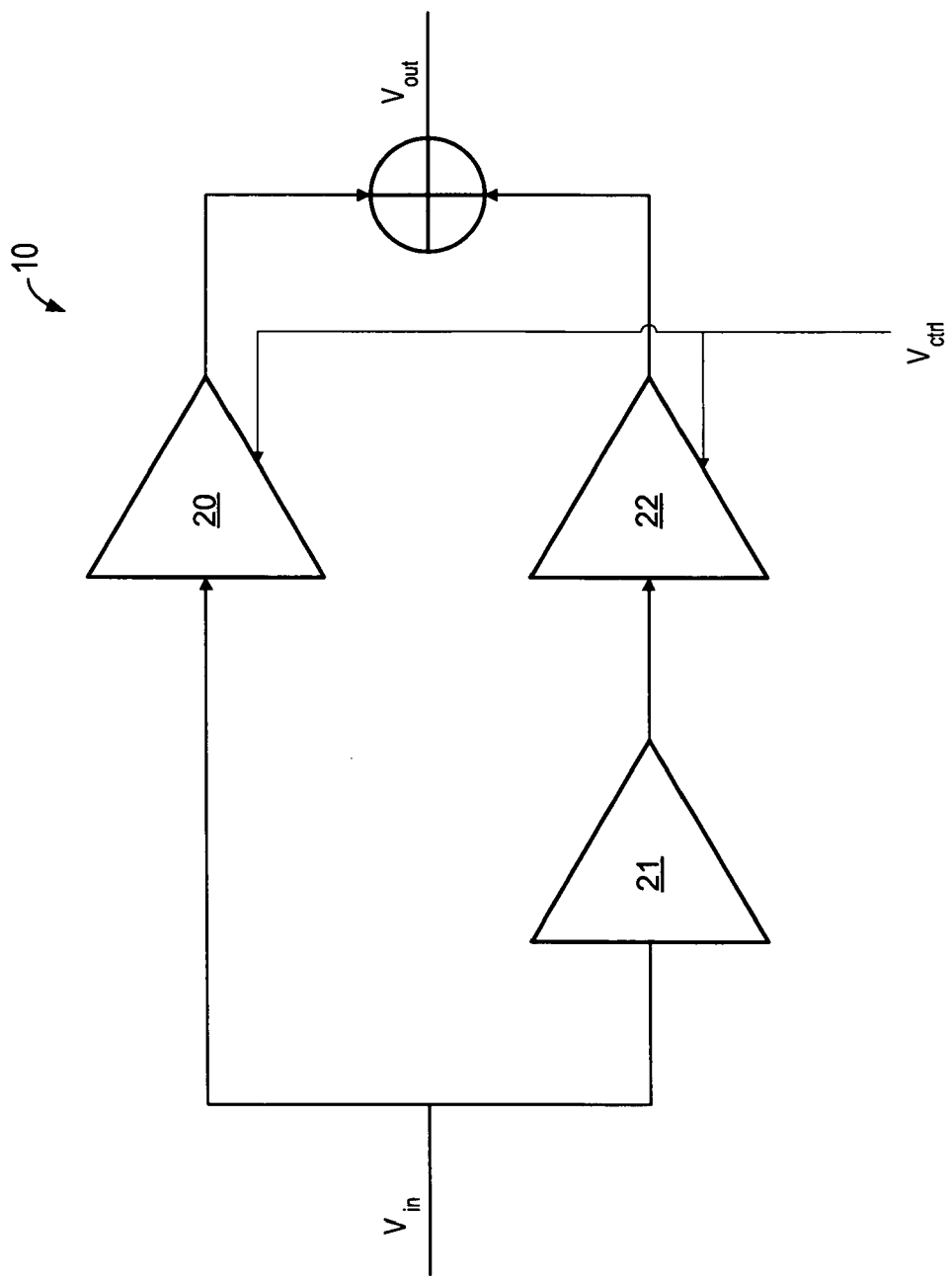
FIG. 2 is a block diagram of a ring oscillator delay stage according to some embodiments.

FIG. 2 is a block diagram of an instance of delay stage 10 according to some embodiments. As mentioned above, delay stage 10 of FIG. 2 receives a single-ended or differential input signal $V_{in}$ from a preceding delay stage 10 and outputs a single-ended or differential signal $V_{out}$ to a next delay stage 10 of ring oscillator 1. An upper, or "fast", path of delay stage 10 includes delay element 20, while a lower, or "slow" path of delay stage 10 includes delay elements 21 and 22 connected in series.

According to some embodiments, a propagation delay associated with the "fast" path is less than a delay associated with by the "slow" path. Although the delay elements of the "fast" path and the "slow" path are similarly-represented and shown in a 1-to-2 ratio, the paths may include any number of different elements in any ratio.

Control signal $V_{ctrl}$ controls the interpolation of the "fast" path delay with the "slow" path delay. More specifically, control signal $V_{ctrl}$ determines the relative amounts of "fast" path delay and "slow" path delay that contribute to the total delay of delay stage 10. The resulting total delay provided by delay stage 10 may satisfy the relation: $delay_{slow} \geq delay_{total} \geq delay_{fast}$.

Figure 3:
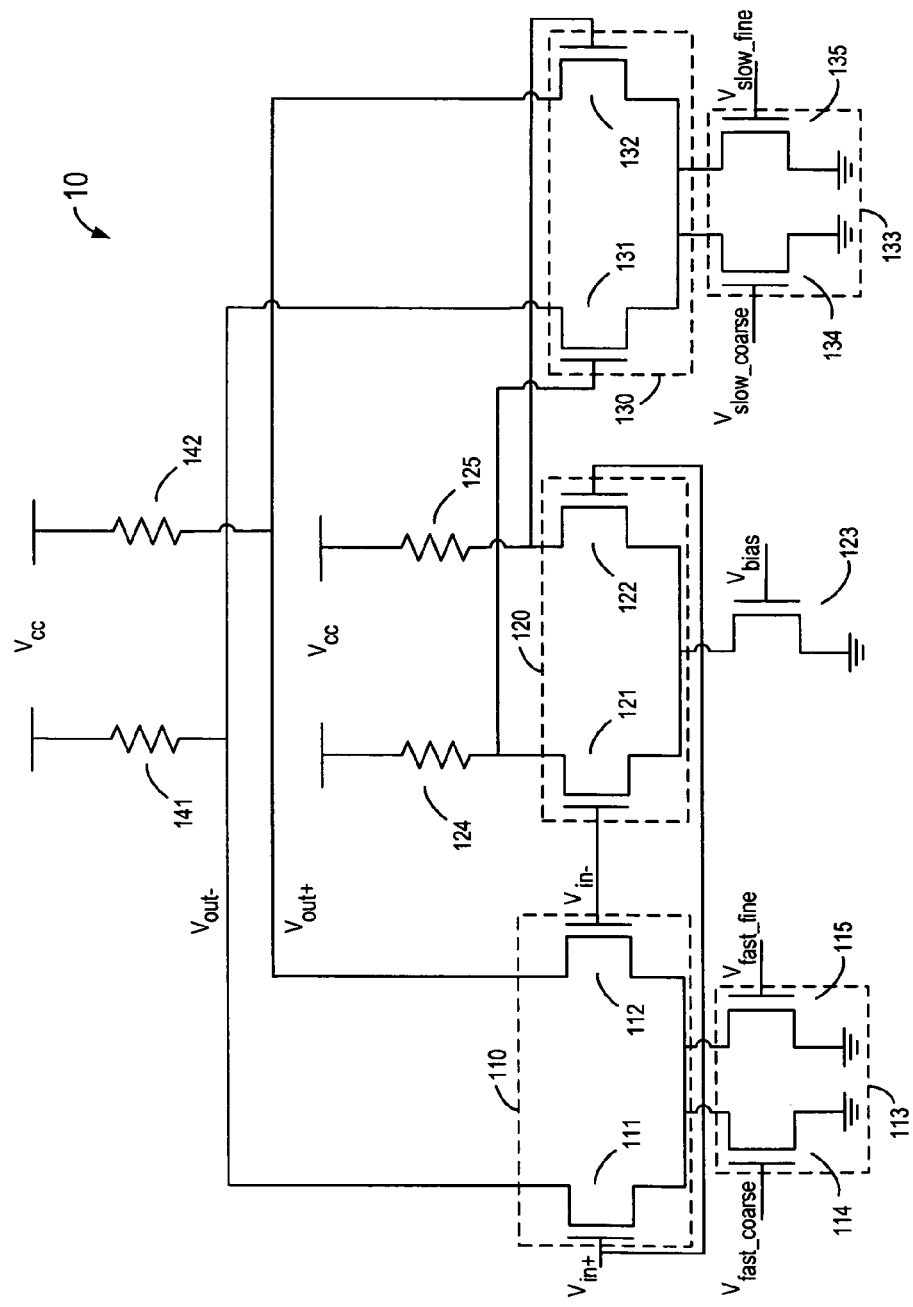
FIG. 3 is a schematic diagram of a ring oscillator delay stage according to some embodiments.

FIG. 3 is a schematic diagram of delay stage 10 according to some embodiments. Delay stage 10 of FIG. 3 comprises differential pairs 110, 120 and 130. Differential pairs 110, 120 and 130 may roughly correspond to delay elements 20, 21 and 22, respectively, of FIG. 2. Briefly, differential pair 110 receives a differential input signal and outputs a first differential signal. Differential pair 120 also receives the differential input signal and outputs a second differential signal to differential pair 130. Differential pair 130 receives the second differential signal and outputs the first differential signal. The first differential signal is delayed from the differential input signal based on relative amounts of current steered through differential pair 110 and differential pair 130.

Differential pair 110 includes NMOS transistor 111 and NMOS transistor 112. A gate of transistor 111 receives component $V_{in}+$ of the differential input signal $V_{in}$, and a gate of transistor 112 receives component $V_{in}-$ of $V_{in}$. Sources of transistors 111 and 112 are coupled to one another and to current-steering circuit 113. Current-steering circuit 113 includes NMOS transistor 114 and NMOS transistor 115, which may function as voltage controllable current sources. Drains of transistors 114 and 115 are coupled to the sources of transistors 111 and 112.

Gates of transistors 114 and 115 receive, respectively, signals $V_{fast\_coarse}$ and $V_{fast\_fine}$. These signals assist in determining an amount of current steered through differential pair 110. Transistors 114 and 115 may be sized relative to one another such that a change in the level of $V_{fast\_coarse}$ will have a greater effect on the amount of current steered to differential pair 110 than an identical change in the level of $V_{fast\_fine}$.

Differential pair 120 includes NMOS transistor 121 and NMOS transistor 122. A gate of transistor 121 also receives component $V_{in}+$ of $V_{in}$, and a gate of transistor 122 also receives component $V_{in}-$ of $V_{in}$. Sources of transistors 121 and 122 are coupled to one another and to a drain of NMOS transistor 123. Drains of transistors 121 and 122 are coupled to resistors 124 and 125, which are in turn coupled to a supply voltage.

A gate of transistor 123 receives signal $V_{bias}$. $V_{bias}$ may be used in some embodiments to steer current to or from differential pair 120, and/or may be fixed at a voltage that is sufficient to turn on transistor 123.

Differential pair 130 includes NMOS transistor 131 and NMOS transistor 132. A gate of transistor 131 is coupled to a drain of transistor 121 and a gate of transistor 132 is coupled to a drain of transistor 122. Differential pair 120 therefore outputs a differential signal that is received by differential pair 130. FIG. 3 also shows a drain of transistor 131 coupled to a drain of transistor 111 and to resistor 141, and a drain of transistor 132 coupled to a drain of transistor 112 and to resistor 142. Resistors 141 and 142 are in turn coupled to the supply voltage.

Sources of transistors 131 and 132 are coupled to one another and to current-steering circuit 133. Current-steering circuit 133 comprises NMOS transistor 134 and NMOS transistor 135, which may function as voltage controllable current sources. Drains of transistors 134 and 135 are coupled to the sources of transistors 131 and 132.

Gates of transistors 134 and 135 receive signals $V_{slow\_coarse}$ and $V_{slow\_fine}$, respectively. These signals assist in determining an amount of current steered through differential pair 130. As described above with respect to transistors 114 and 115, transistors 134 and 135 may be sized relative to one another such that a change in the level of $V_{slow\_coarse}$ will have a greater effect on the amount of current steered to differential pair 130 than an identical change in the level of $V_{slow\_fine}$.

FIG. 3 also shows components $V_{out}+$ and $V_{out}-$ of differential output signal $V_{out}$. A delay between $V_{in}$ and $V_{out}$ is based on relative amounts of current steered to the "fast path" (differential pair 110) by current-steering circuit 113 and to the "slow path" (differential pairs 120 and 130) by current-steering circuit 133. As previously described, these currents may be controlled by the control signals $V_{fast\_coarse}$, $V_{fast\_fine}$, $V_{slow\_coarse}$ and $V_{slow\_fine}$. The separate "coarse" and "fine" control signals may allow for a lower frequency gain once that the oscillation frequency of oscillator 1 is locked. Moreover, the use of resistive loads may provide improved noise performance over delay stages using PMOS loads.

Figure 4:
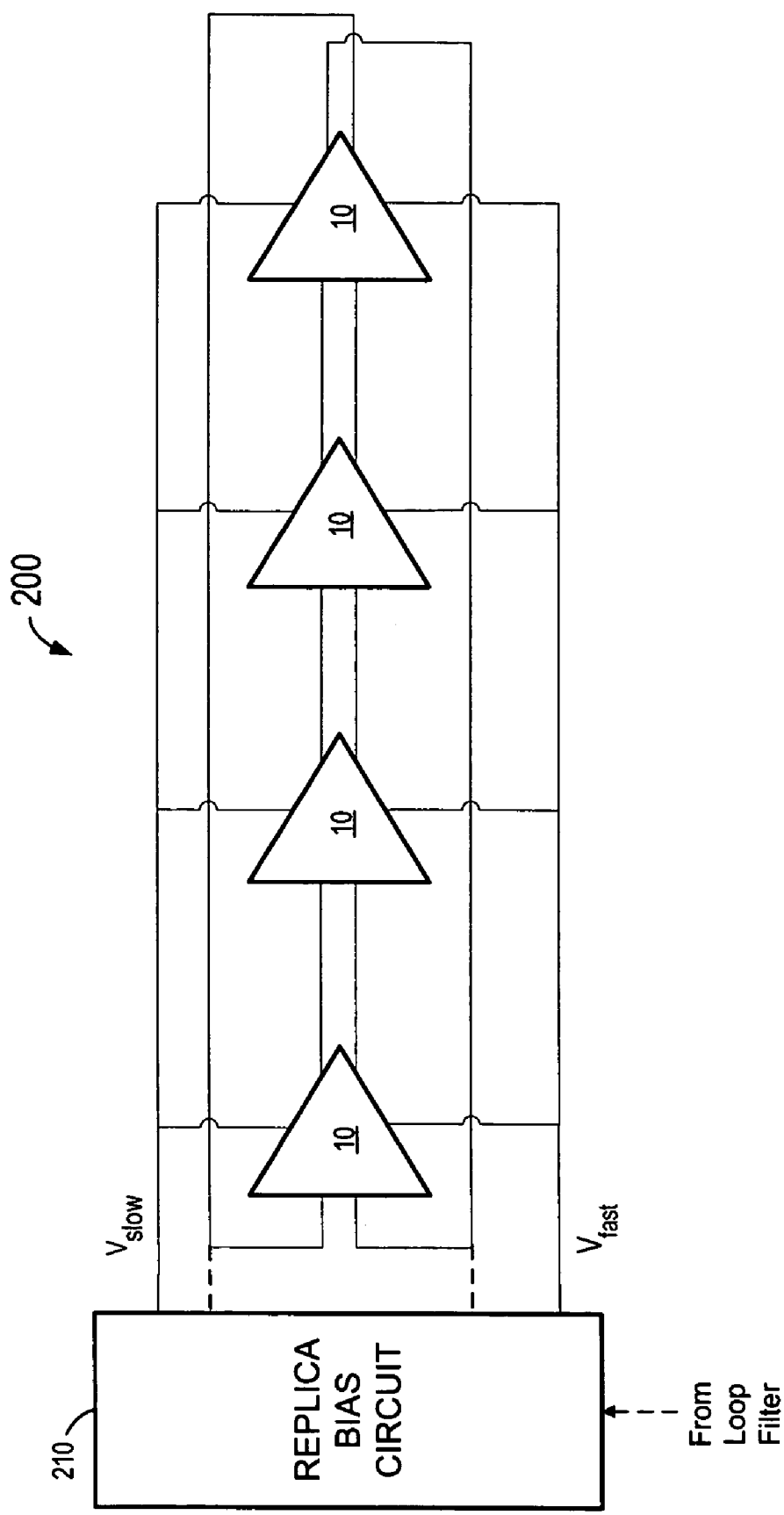
FIG. 4 is a block diagram of a ring oscillator according to some embodiments.

FIG. 4 is a block diagram of a ring oscillator according to some embodiments. Oscillator 200 comprises four instances of delay stage 10. Each delay stage 10 receives control signals $V_{fast}$ and $V_{slow}$, which may respectively include signals $V_{fast\_coarse}$ and $V_{fast\_fine}$, and $V_{slow\_coarse}$ and $V_{slow\_fine}$. Other unshown signal lines may connect stages 10 to a supply voltage, ground, and bias signal $V_{bias}$.

Replica bias circuit 210 may be used to generate control signals $V_{fast}$ and $V_{slow}$ of FIG. 4. As illustrated by dashed lines, replica bias circuit 210 may generate the signals based on a differential output signal received from delay stages 10 and/or based on a signal received from a loop filter of a phase-locked loop or a clock-and-data recovery circuit. Replica bias circuit 210 may also be used to generate control signal $V_{bias}$. Ring oscillator 200 may comprise any suitable replica bias circuit 210 that is or becomes known.

Figure 5:
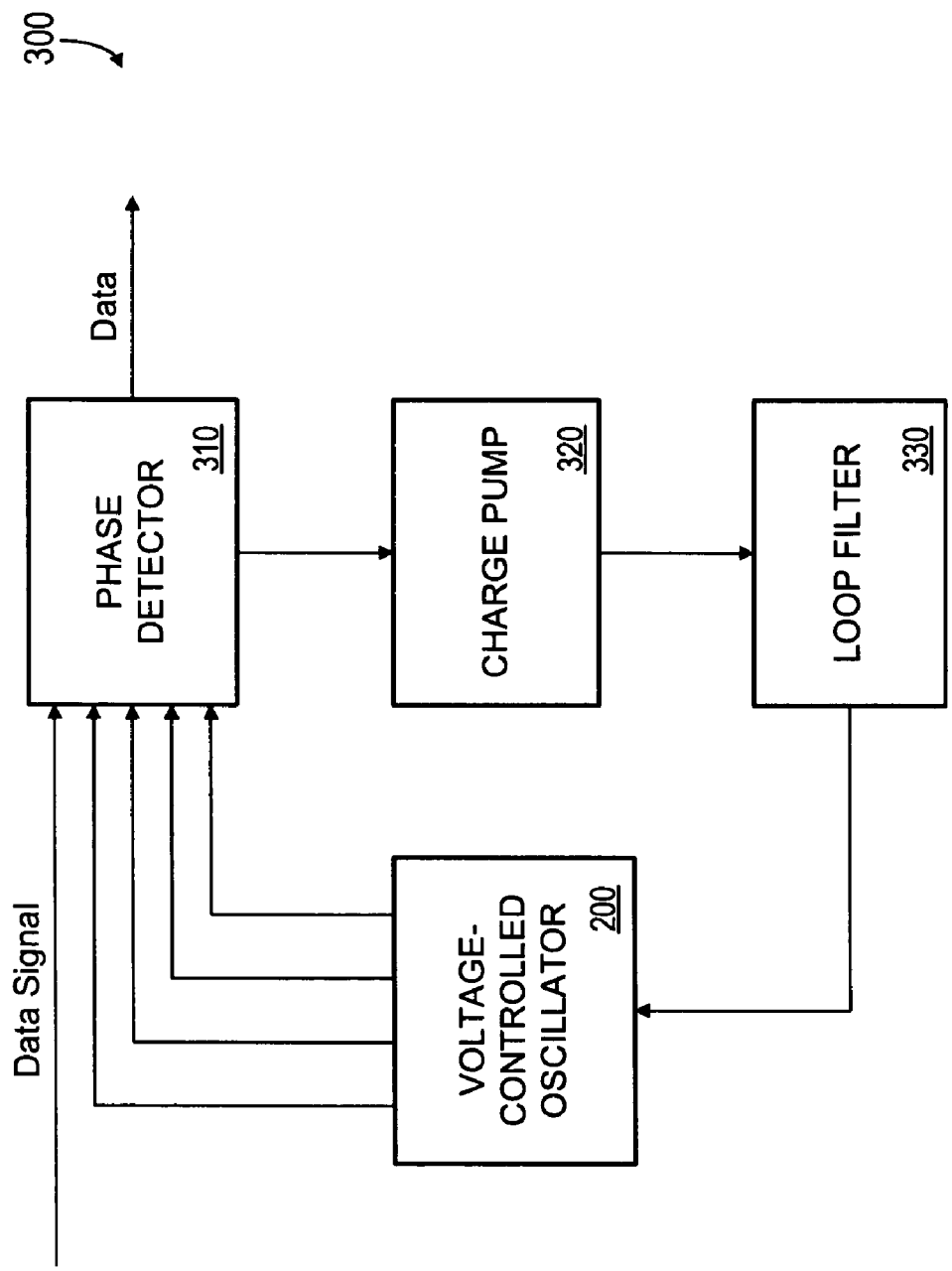
FIG. 5 is a block diagram of a clock-and-data recovery circuit according to some embodiments.

FIG. 5 comprises a block diagram of clock-and-data recovery circuit 300 including ring oscillator 200 according to some embodiments. Circuit 300 may be used to extract a clock signal from a data signal and to extract data from the data signal based on the extracted clock signal. Circuit 300 includes phase detector 310, charge pump 320, loop filter 330 and voltage-controlled oscillator 200.

Phase detector 310 receives a data signal including an embedded clock signal. Phase detector 310 also receives four differential clock signals from oscillator 200, which may comprise the output signals of each stage 10 of oscillator 200. Phase detector 310 compares the phase of the input data signal to the differential clock signals and outputs a signal indicating the phase difference to charge pump 320. The signal is fed through charge pump 320 and loop filter 330 to oscillator 200. An oscillation frequency and/or phase of oscillator 200 is therefore controlled such that one of the four differential clock signals matches the frequency and/or phase of the input data signal. Phase detector 310 then uses the matched differential signal to extract data from the input data signal. Embodiments maybe used in conjunction with any suitable clock-and-data recovery circuit.

Figure 6:
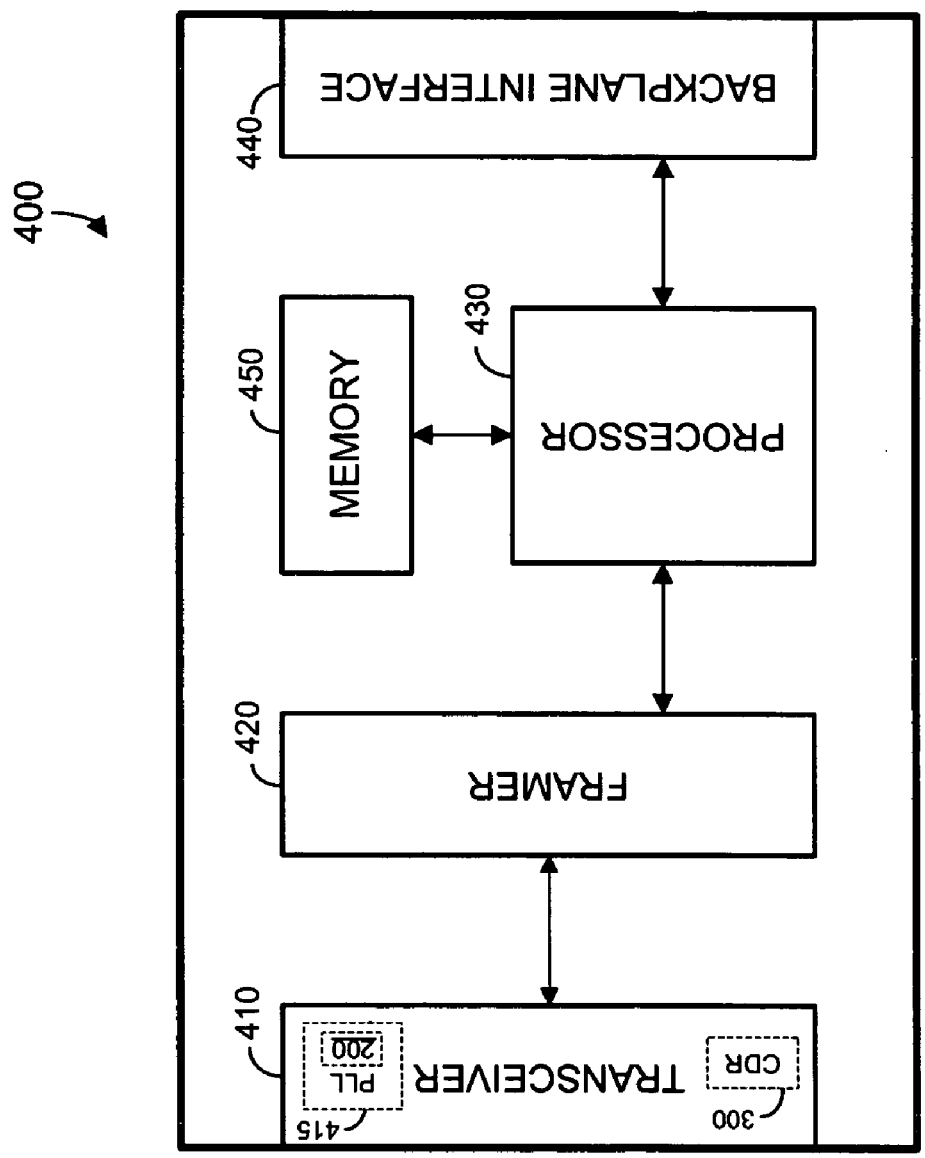
FIG. 6 is a diagram illustrating a module according to some embodiments.

FIG. 6 is a block diagram of line card 400 according to some embodiments. Line card 400 may provide an interface between a main backplane and an optical network. Line card 400 may comprise a circuit board onto which the illustrated elements are mounted. The elements include transceiver 410, framer 420, processor 430, backplane interface 440, and memory 450.

Transceiver 410 may be an optical transceiver including elements for transmitting and receiving data over an optical physical layer. A transmitting section of transceiver 410 may comprise phase-locked loop 415 utilizing ring oscillator 200 of FIG. 4. A receiving section of transceiver 410 may include a clock-and-data recovery circuit such as circuit 300 of FIG. 5. Transceiver 410 may also comprise a serial/deserializer to process outgoing/incoming data.

Framer 420 may receive and decapsulate encapsulated data that is received by the receiving section of transceiver 410. Framer 420 may also encapsulate data received from processor 430 prior to transmitting the data to transceiver 420. Processor 430 receives/transmits data from/to backplane interface 440, which communicates with a network server or a network switch backplane. Memory 450 is in communication with processor 430 and may comprise a Double Data rate Random Access Memory, a Quad Data rate Random Access Memory, or any other suitable memory. Memory 450 may store code executable by processor 430 and/or other data for use by processor 430.

The several embodiments described herein are solely for the purpose of illustration. Embodiments may include any currently or hereafter-known current sources, transistors, resistive elements and/or oscillators. Therefore, persons in the art will recognize from this description that other embodiments may be practiced with various modifications and alterations.

What is claimed is:

1. A circuit comprising:
   a ring oscillator delay stage, the delay stage comprising:
      a first differential pair to receive a differential input signal and to output a first differential signal, the first differential pair comprising:
         a first transistor, a gate of the first transistor to receive a first component of the differential input signal and a source of the first transistor coupled to a first current-steering circuit; and
         a second transistor, a gate of the second transistor to receive a second component of the differential input signal and a source of the second transistor coupled to the first current-steering circuit and to the source of the first transistor;
      a second differential pair to receive the differential input signal and to output a second differential signal, the second differential pair comprising:
         a third transistor, a gate of the third transistor to receive the first component of the differential input signal; and a fourth transistor, a gate of the fourth transistor to receive the second component of the differential input signal, and a source of the fourth transistor coupled to the source of the third transistor; and a third differential pair to receive the second differential signal from the second differential pair and to output the first differential signal, the third differential pair comprising:

a fifth transistor, a gate of the fifth transistor coupled to a drain of the third transistor, a source of the fifth transistor coupled to a second current-steering circuit, and a drain of the fifth transistor coupled to a drain of the first transistor; and a sixth transistor, a gate of the sixth transistor coupled to a drain of the fourth transistor, a source of the sixth transistor coupled to the second current-steering circuit and to the source of the fifth transistor, and a drain of the sixth transistor coupled to a drain of the second transistor, wherein the first current-steering circuit comprises:

a seventh transistor, a gate of the seventh transistor to receive a first coarse current-steering signal, and a drain of the seventh transistor coupled to the source of the first transistor and to the source of the second transistor; and an eighth transistor, a gate of the eighth transistor to receive a first fine current-steering signal, and a drain of the eighth transistor coupled to the source of the first transistor and to the source of the second transistor, and wherein the second current-steering circuit comprises:

a ninth transistor, a gate of the ninth transistor to receive a second coarse current-steering signal, and a drain of the ninth transistor coupled to the source of the fifth transistor and to the source of the sixth transistor, and a tenth transistor, a gate of the tenth transistor to receive a second fine current-steering signal, and a drain of the tenth transistor coupled to the source of the fifth transistor and to the source of the sixth transistor, and wherein an amount of delay between the differential input signal and the first differential signal is based on the first coarse current-steering signal, the first fine current-steering signal, the second coarse current-steering signal, and the second fine current-steering signal.

2. A circuit according to claim 1, wherein the amount of delay increases as more current is steered by the second current-steering circuit.

3. A circuit according to claim 1, further comprising:
a first primarily resistive element coupled to the drain of the first transistor and to a supply voltage; and
a second primarily resistive element coupled to the drain of the second transistor and to the supply voltage.

4. A circuit according to claim 3, further comprising:
a third primarily resistive element coupled to a drain of the third transistor and to the supply voltage; and
a fourth primarily resistive element coupled to a drain of the fourth transistor and to the supply voltage.

5. A circuit according to claim 1, wherein the first current-steering circuit comprises:
one or more voltage-controllable current sources, and
wherein the second current-steering circuit comprises:
a second one or more voltage-controllable current sources.

6. A circuit according to claim 1, further comprising:
a second ring oscillator delay stage, the second delay stage comprising:
a fourth differential pair to receive the first differential signal and to output a third differential signal, the fourth differential pair coupled to a third current-steering circuit;
a fifth differential pair to receive the first differential signal and to output a fourth differential signal; and
a sixth differential pair to receive the fourth differential signal from the fifth differential pair and to output the third differential signal, the sixth differential pair coupled to a fourth current-steering circuit,
wherein an amount of delay between the first differential signal and the third differential signal is based on relative amounts of current steered by the third current-steering circuit and the fourth current-steering circuit.

7. A method for a ring oscillator, comprising:
receiving a first component of a differential input signal at a gate of a first transistor, a source of the first transistor coupled to a first current-steering circuit;
receiving a second component of the differential input signal at a gate of the second transistor, a source of the second transistor coupled to the first current-steering circuit and to the source of the first transistor;
receiving a first coarse current-steering signal with a third transistor of the first current-steering circuit, a drain of the third transistor coupled to the source of the first transistor and to the source of the second transistor;
receiving a first fine current-steering signal with a fourth transistor of the first current-steering circuit, a drain of the fourth transistor coupled to the source of the first transistor and to the source of the second transistor;
receiving the first component of the differential input signal at a gate of a third transistor;
receiving the second component of the differential input signal at a gate of the fourth transistor, a source of the fourth transistor coupled to a source of the third transistor;
outputting a first differential signal at a drain of the third transistor and at a drain of the fourth transistor;
receiving a first component of the first differential signal at a gate of a fifth transistor coupled to a drain of the third transistor, a source of the fifth transistor coupled to a second current-steering circuit, and a drain of the fifth transistor coupled to a drain of the first transistor;
receiving a second component of the first differential signal at a gate of a sixth transistor coupled to a drain of the fourth transistor, a source of the sixth transistor coupled to the second current-steering circuit and to the source of the fifth transistor, and a drain of the sixth transistor coupled to a drain of the second transistor;
receiving a second coarse current-steering signal with a seventh transistor of the second current-steering circuit, a drain of the seventh transistor coupled to the source of the fifth transistor and to the source of the sixth transistor;
receiving a second fine current-steering signal with an eighth transistor of the second current-steering circuit, a drain of the eighth transistor coupled to the source of the fifth transistor and to the source of the sixth transistor; and
outputting a second differential signal outputting a first differential signal at a drain of the first transistor and at a drain of the second transistor, wherein an amount of delay between the differential input signal and the second differential signal is based on the first coarse current-steering signal, the first fine current-steering signal, the second coarse current-steering signal, and the second fine current-steering signal.

8. A method according to claim 7, further comprising:
receiving the second differential signal with a fourth differential pair coupled to a third current-steering circuit;
receiving a third current-steering signal with the third current-steering circuit;
receiving the second differential signal with a fifth differential pair;
outputting a third differential signal with the fifth differential pair;
receiving the third differential signal with a sixth differential pair coupled to a fourth current-steering circuit;
receiving a fourth current-steering signal with the fourth current-steering circuit; and
outputting a fourth differential signal with the fourth differential pair and the sixth differential pair,
wherein an amount of delay between the second differential signal and the fourth differential signal is based on relative amounts of current steered by the third current-steering circuit and the fourth current-steering circuit.

9. A method according to claim 7, further comprising:
receiving a control signal from a loop filter; and
determining the first coarse current-steering signal, the first fine current-steering signal, the second coarse current-steering signal, and the second fine current-steering signal based on the control signal.

10. A system comprising:
a transceiver to transmit and receive data comprising:
  a ring oscillator delay stage, the delay stage comprising:
    a first differential pair to receive a differential input signal and to output a first differential signal, the first differential pair comprising:
      a first transistor, a gate of the first transistor to receive a first component of the differential input signal and a source of the first transistor coupled to a first current-steering circuit; and
      a second transistor, a gate of the second transistor to receive a second component of the differential input signal and a source of the second transistor coupled to the first current-steering circuit and to the source of the first transistor coupled to a first current-steering circuit;
    a second differential pair to receive the differential input signal and to output a second differential signal, the second differential pair comprising:
      a third transistor, a gate of the third transistor to receive the first component of the differential input signal; and
      a fourth transistor, a gate of the fourth transistor to receive the second component of the differential input signal, and a source of the fourth transistor coupled to the source of the third transistor; and
    a third differential pair to receive the second differential signal from the second differential pair and to output the first differential signal, the third differential pair comprising:
      a fifth transistor, a gate of the fifth transistor coupled to a drain of the third transistor, a source of the fifth transistor coupled to a second current-steering circuit, and a drain of the fifth transistor coupled to a drain of the first transistor; and
      a sixth transistor, a gate of the sixth transistor coupled to a drain of the fourth transistor, a source of the sixth transistor coupled to the second current-steering circuit and to the source of the fifth transistor, and a drain of the sixth transistor coupled to a drain of the second transistor,
    wherein the first current-steering circuit comprises:
      a seventh transistor, a gate of the seventh transistor to receive a first coarse current-steering signal, and a drain of the seventh transistor coupled to the source of the first transistor and to the source of the second transistor and
      an eighth transistor, a gate of the eighth transistor to receive a first fine current-steering signal, and a drain of the eighth transistor coupled to the source of the first transistor and to the source of the second transistor, and
    wherein the second current-steering circuit comprises:
      a ninth transistor, a gate of the ninth transistor to receive a second coarse current-steering signal, and a drain of the ninth transistor coupled to the source of the fifth transistor and to the source of the sixth transistor; and
      a tenth transistor, a gate of the tenth transistor to receive a second fine current-steering signal, and a drain of the tenth transistor coupled to the source of the fifth transistor and to the source of the sixth transistor, and
    wherein an amount of delay between the differential input signal and the first differential signal is based on the first coarse current-steering signal, the first fine current-steering signal, the second coarse current-steering signal, and the second fine current-steering signal;
  a processor to process the data; and
  a double data rate memory in communication with the processor.

11. A system according to claim 10, wherein the amount of delay increases as more current is steered by the second current-steering circuit.

12. A system according to claim 11, further comprising:
a first primarily resistive element coupled to the drain of the first transistor and to a supply voltage; and
a second primarily resistive element coupled to the drain of the second transistor and to the supply voltage.

13. A system according to claim 12, further comprising:
a third primarily resistive element coupled to a drain of the third transistor and to the supply voltage; and
a fourth primarily resistive element coupled to a drain of the fourth transistor and to the supply voltage.

14. A system according to claim 10, the transceiver further comprising:
a second ring oscillator delay stage, the second delay stage comprising:
  a fourth differential pair to receive the first differential signal and to output a third differential signal, the fourth differential pair coupled to a third current-steering circuit;
  a fifth differential pair to receive the first differential signal and to output a fourth differential signal; and
  a sixth differential pair to receive the fourth differential signal from the fifth differential pair and to output the third differential signal, the sixth differential pair coupled to a fourth current-steering circuit,
wherein an amount of delay between the first differential signal and the third differential signal is based on relative amounts of current steered by the third current-steering circuit and the fourth current-steering circuit.

* * * * *